Dec. 23, 1952 E. H. HUGENHOLTZ 2,623,177

AUTOMATIC FREQUENCY CONTROL SYSTEM

Filed Nov. 2, 1950

INVENTOR

EDUARD HERMAN HUGENHOLTZ

BY Fred M Vogel

AGENT

Patented Dec. 23, 1952

2,623,177

UNITED STATES PATENT OFFICE 2,623,177

AUTOMATIC FREQUENCY CONTROL SYSTEM

Eduard Herman Hugenholtz, Hilversum, Netherlands, assignor to Hartford National Bank and Trust Company, Hartford, Conn., as trustee Application November 2, 1950, Serial No. 193,603
In the Netherlands December 7, 1949

3 Claims. (Cl. 250—36)

Copending U. S. patent application Serial No. 75,804, filed February 11, 1949, describes a frequency control system comprising an oscillator and a frequency correction circuit coupled to the oscillator. The automatic frequency control voltage supplied to the frequency corrector is derived from a tuned discriminator which may be, for example, a band-pass filter discriminator, comprising two rectifiers the output resistances of which are connected in series. According to the said patent application, a control oscillation having a frequency corresponding substantially to the central band-pass filter frequency is applied to at least one of the rectifier circuits so that this rectifier circuit operates as a beat frequency discriminator providing phase stabilization of the oscillator by synchronizing the oscillator with the control oscillation.

When the oscillator frequency is widely divergent from the central band-pass frequency, the discriminator operates as a band-pass filter discriminator. In this case the catching range of the control system, i. e. the maximum corrigible frequency difference, corresponds to that of a band-pass filter discriminator. As soon as the output voltage of the band-pass filter discriminator has brought the oscillator frequency within the smaller catching range of the beat frequency discriminator, synchronism between the oscillator voltage and the control-oscillation occurs.

In order to ensure synchronism, the circuit arrangement should be proportioned so that the band-pass filter discriminator reduces the frequency deviation to a point within the catching range of the beat-frequency discriminator.

In practice, these proportioning requirements sometimes provide difficulties. This is true, for example, when the frequency difference to be corrected is considerable, since in this case the sensitivity of the tuned discriminator frequency control circuit and/or the catching range of the beat-frequency discriminator frequency control circuit must be comparatively large. Moreover, these proportioning requirements cannot be fulfilled, or can be fulfilled only with difficulty, if the frequency of the control oscillation is variable. For example, when the control oscillator frequency is variable relative to the central discriminator frequency, the frequency difference may exceed the catching range of the beat-frequency discriminator frequency control circuit, which range is limited by other proportioning requirements such as noise sensitivity.

These disadvantages are mitigated by automatically varying, in low frequency rhythm, the tuning of the oscillator if stabilisation fails to occur until the beat-frequency discriminator frequency control circuit brings about synchronization on the control oscillation. However, the additional means required therefor are complicated and, moreover, involve a slight delay in synchronization, which delay may be undesirable in various practical uses.

The principal object of the present invention is to provide an automatic frequency control system of the above type in which these disadvantages are overcome.

Further objects of the invention will appear from the following description.

According to the invention, in a system of the above type comprising a tunable control oscillator, one output terminal for the automatic frequency control is constituted by the junction point of the output resistances. The other terminal is constituted by an adjustable, preferably earthed tapping point of a resistance shunting the series-combination of the output resistances. The tapping point adjustment varies with the tuning of the control oscillator so that, at a principal oscillator frequency approximately corresponding to the central discriminator frequency and upon a variation of the tuning of the control oscillator about the central discriminator frequency, the principal oscillator frequency follows the latter, the control frequency otherwise being inoperative.

In order that the invention may be more clearly understood and readily carried into effect, it will now be described in detail with reference to the accompanying drawing, in which.

Figure 1:
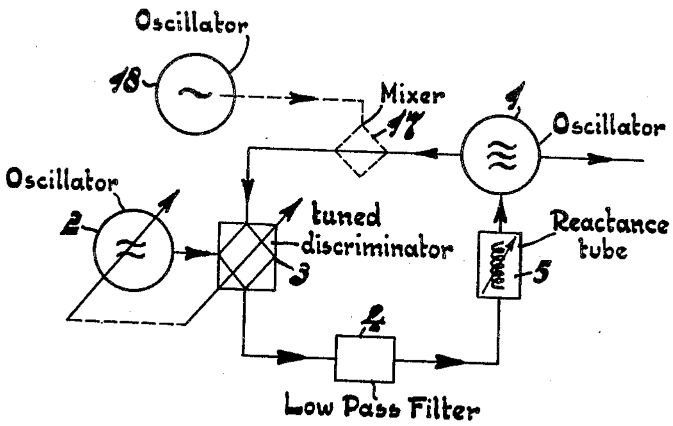
Fig. 1 shows a block diagram of a device according to the invention.

Referring now to the drawing and more particularly to Fig. 1, the refereence numeral 1 designates a high-frequency oscillator, the frequency of which is required to be synchronized with the frequency of a control oscillation produced by an oscillator 2. The oscillation produced by the oscillator 1 and the oscillation from the oscillator 2 are supplied to a tuned discriminator 3, from which a control-voltage for automatic frequency correction of the oscillator 1 is taken, this voltage being fed through a low-pass filter 4 to a frequency corrector 5 coupled to the oscillator 1. Frequency corrector 5 may be constituted, for example, by a reactance tube circuit.

Figure 2:
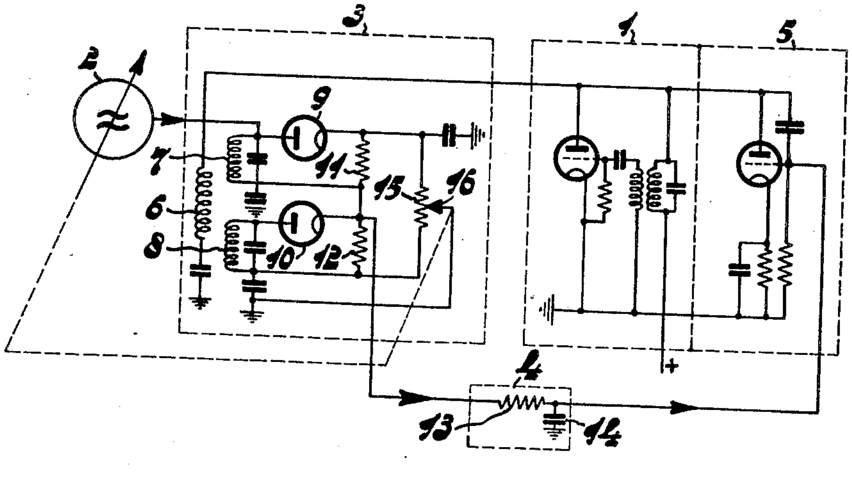
Fig. 2 shows in detail the circuit-arrangement thereof.

According to the invention, as is shown diagrammatically in the block diagram of Fig. 1, the control-oscillation is taken from a tunable oscillator 2, the tuning means of which are coupled to adjusting means in the discriminator 3 in a manner to be described more fully with reference to Fig. 2.

In Fig. 2 the high-frequency oscillator 1 comprises a grid-controlled electron tube in a feed-back oscillator circuit-arrangement. The output circuit of oscillator 1 is coupled to the discriminator 3. For this purpose, the anode circuit of this oscillator tube includes two circuits 7 and 8 which are tuned respectively to frequencies on both sides of the desired central discriminator frequency. To each of these circuits is connected in parallel the series-combination of a rectifier 9, 10 respectively and an output resistance 11, 12 respectively. One end of each of the circuits is connected to the anodes of each of the rectifiers and the other end is grounded through smoothing condensers. The cathode of the rectifier 10 is furthermore connected to the end of the circuit 7 remote from the anode of the rectifier 9, from which junction point the control voltage for automatic frequency correction of the oscillator 1 is taken. This control voltage is supplied, through a low-pass filter consisting of a series resistance 13 and a grounded by-pass condenser 14, to the reactance tube arrangement 5. Reactance tube 5 is coupled to the oscillator 1. This reactance tube arrangement, which is shown in a simple form in the drawing, may be of any desired type.

The automatic frequency control circuit so far described is a circuit with a tuned discriminator commonly used for frequency control. Across the output resistances 11 and 12 a voltage is developed which is positive or negative depending upon deviation of the oscillator frequency in one direction or the other from the central discriminator frequency. This voltage is utilized as a control-voltage for automatic frequency correction. If the oscillator frequency corresponds to the central discriminator frequency, no control-voltage is produced. By supplying the voltage from the control-oscillator 2 to the rectifier 9 it is ensured, that, owing to the automatic frequency control circuit becoming operative as a beat-frequency discriminator, phase stabilisation of the oscillator-frequency on the control-oscillation takes place as soon as the output voltage of the tuned discriminator brings the oscillator frequency into the catching range of the beat frequency discriminator.

So long as oscillators 1 and 2 are not in synchronism, an alternating voltage having a frequency equal to the difference between the frequencies of oscillators 1 and 2 will be developed across resistances 11 and 12. This alternating voltage forms a second control voltage and is superimposed on the direct control voltage produced by the band-pass filter discriminator action. The alternating voltage component thus present in the automatic frequency control voltage produces frequency modulation of the oscillator 1, in so far as the frequency corrector 5 is capable of following variations in the difference frequency. If this frequency modulation results in a short period of synchronism between the oscillators 1 and 2, the band-pass filter discriminator will not provide control voltage, provided the frequency of the control voltage exactly corresponds to the central frequency of the band-pass filter. In this case the automatic frequency control is primarily taken over by the beat discriminator. If the control voltage frequency differs from the central frequency of the band-pass filter, the band-pass filter discriminator circuit itself provides a direct voltage which is neutralized by an equal direct voltage of opposite polarity supplied by the beat discriminator, and thus no disturbing effect is produced. The action of the beat discriminator control circuit is described more fully in the copending application referred to hereinbefore.

However, if, for example, the frequency difference to be corrected is considerable, the device should be proportioned so that, apart from a high sensitivity of the automatic frequency control circuit with tuned discriminator, a sufficient catching range of the beat frequency discriminator automatic frequency control circuit is obtained so that the first-mentioned automatic frequency control circuit brings the frequency to be corrected into the catching range of the beat frequency discriminator automatic frequency control circuit. This proportioning requirement involves difficulties in practice, particularly if, as in the present embodiment, the frequency of the control oscillation is variable. In this event the difference between the adjusted control oscillation frequency and the central discriminator frequency may sometimes exceed the catching range of the beat frequency discriminator automatic frequency control circuit and control, to establish synchronism with the control oscillation does not occur automatically.

According to the invention, in order to overcome the disadvantages referred to, a resistance 15 constructed as a potentiometer, the tapping point 16 of which is grounded, is connected in parallel with the series connected output resistances 11 and 12 of the discriminator 3. The means for adjusting this tapping point is coupled to the tuning means, for example, the tuning condenser of the frequency determining circuit of the control oscillator 2.

If the output resistances 11 and 12 are equal, the frequency of the oscillator 1 will tend towards the central discriminator frequency when the tapping point 16 is adjusted to the center position.

If, however, the tapping point 16 is shifted from the center position, then, in spite of the presence of the control oscillator 2, a control voltage relative to earth is produced, so that the central frequency is apparently shifted with respect to the central frequency determined by the tuning frequencies of the circuits 7 and 8. It furthermore appears that the direction of this shift of the central frequency varies with the direction in which the tapping point is shifted on the resistance 15.

In order that, in the case of variation of the control oscillator tuning, the frequency deviation with respect to the control frequency, left after readjustment by the automatic frequency control circuit with tuned discriminator, may invariably fall within the catching range of the beat frequency discriminator automatic frequency control circuit, the tapping point adjustment varies with the control oscillator tuning. This is accomplished in such manner that, at an oscillator frequency approximately equalling the central frequency, the oscillator frequency follows the frequency of the control oscillator, the beat-frequency discriminator automatic frequency control circuit otherwise being inoperative.

In the case described it has been assumed that the voltage taken from the oscillator 1 is supplied directly to the discriminator 3. However, as an alternative, the oscillator frequency may be transformed, prior to being supplied to the discriminator, by supplying the oscillator voltage together with a further auxiliary control oscillation from an additional oscillator stage 18, the frequency of which may be variable, to a mixer stage 17, as shown in broken lines in Fig. 1.

In the embodiment shown in the drawing, the tuned discriminator comprising watcher circuits may be replaced by a so-called band-pass filter discriminator.

While the invention has been described in a particular form thereof and in a particular embodiment, it is not desired that it be limited thereto for obvious modifications thereof will occur to those skilled in the art without departing from the spirit and scope of the invention.

What I claim is:

1. An automatic frequency control circuit arrangement, comprising first oscillator means for producing a first wave having frequency deviations about a central frequency, voltage responsive frequency control means coupled to said first oscillator means, a tuned frequency discriminator circuit comprising a pair of rectifier elements and a pair of series connected output resistance elements, each of said resistance elements being coupled to a respective one of said rectifier elements, means to apply said first wave to said tuned frequency discriminator to produce across said output resistance elements a first output control voltage having polarity and magnitude variations about a given value proportional to the frequency deviations of said first wave from said central frequency, second oscillator means for producing a second wave having a frequency substantially equal to said central frequency, means to apply said second wave to one of said rectifier elements to mix said first and second waves thereby to produce a second output control voltage having a frequency substantially equal to the difference in frequency between said first and second waves, a resistance element having a tapping, means to couple the ends of said resistance element in parallel with said series connected output resistance elements, means intercoupling said tapping and the end of one of said output resistance elements remote from the junction of said output resistance elements, means to couple said junction of said output resistance elements and said end of said one output resistance element to said frequency control means to apply said first and second output control voltages to said frequency control means thereby substantially to suppresss said frequency deviations of said first wave about said central frequency, control means to vary the frequency of said second oscillator means, and means coupled to said control means to vary the position of said tapping on said resistive element thereby to vary said first and second control voltages and to vary said central frequency of said first wave proportional to the frequency variations of said second wave.

2. An automatic frequency control circuit arrangement comprising first oscillator means for producing a first wave having frequency deviations about a central frequency, voltage responsive frequency control means coupled to said first oscillator means, a tuned frequency discriminator circuit comprising a pair of rectifier elements and a pair of series connected output resistance elements, each of said resistance elements being coupled to a respective one of said rectifier elements, means to couple the ends of said output resistance elements, remote from the junction thereof to a point of said circuit arrangements at ground potential, means to apply said first wave to said tuned frequency discriminator thereby to produce across said output resistance elements a first output control voltage having polarity and magnitude variations about a given value proportional to the frequency deviations of said first wave from said central frequency, second oscillator means for producing a second wave having a frequency substantially equal to said central frequency, means to apply said second wave to one of said rectifier elements to mix said first and second waves thereby to produce a second output control voltage having a frequency substantially equal to the difference in frequency between said first and second waves, a resistance element having a tapping, means to couple the ends of said resistance element in parallel with said series connected output resistance elements, means intercoupling said tapping and the end of one of said output resistance elements coupled to said point at ground potential, means to couple said junction of said output resistance elements and said end of said one output resistance element to said frequency control means to apply said first and second output control voltages to said frequency control means thereby substantially to suppress said frequency deviations of said first wave about said central frequency, control means to vary the frequency of said second oscillator means, and means coupled to said control means to vary the position of said tapping on said resistive element thereby to vary said first and second control voltages and to vary said central frequency of said first wave proportional to the frequency variations of said second wave.

3. An automatic frequency control circuit arrangement, comprising first oscillator means for producing a first wave having frequency deviations about a first central frequency, voltage responsive frequency control means coupled to said first oscillator means, second oscillator means for producing a second wave, means to mix said first and second waves to produce a third wave having frequency deviations about a second central frequency, a tuned frequency discriminator circuit comprising a pair of rectifier elements and a pair of series connected output resistance elements, each of said resistance elements being coupled to a respective one of said rectifier elements, means to apply said third wave to said tuned frequency discriminator thereby to produce across said output resistance elements a first output control voltage having polarity and magnitude variations about a given value proportional to the frequency deviations of said first wave from said central frequency, third oscillator means for producing a fourth wave having a frequency substantially equal to said second central frequency, means to apply said fourth wave to one of said rectifier elements to mix said third and fourth waves thereby to produce a second output control voltage having a frequency substantially equal to the difference in frequency between said third and fourth waves, a resistance element having a tapping, means to couple the ends of said resistance element in parallel with said series connected output resistance elements, means intercoupling said tapping and the end of one of said output resistance elements remote from the junction of said output resistance elements, means to couple said junction of said output resistance elements and said end of said one output resistance element to said frequency control means to apply said first and second output control voltages to said frequency control means thereby substantially to suppress said frequency deviations of said first wave about said central frequency, control means to vary the frequency of said third oscillator means, and means coupled to said control means to vary the position of said tapping on said resistive element thereby to vary said first and second control voltages and to vary said central frequency of said first wave proportional to the frequency variations of said fourth wave.

EDUARD HERMAN HUGENHOLTZ.

REFERENCES CITED

The following references are of record in the file of this patent:

UNITED STATES PATENTS

| Number | Name | Date |
|---|---|---|
| 2,341,649 | Peterson | Feb. 15, 1944 |
| 2,406,125 | Ziegler et al. | Aug. 20, 1946 |